(12) United States Patent
Abe et al.

(10) Patent No.: US 10,372,251 B2
(45) Date of Patent: Aug. 6, 2019

(54) DISPLAY DEVICE

(71) Applicant: Japan Display Inc., Tokyo (JP)

(72) Inventors: Hiroyuki Abe, Tokyo (JP); Takayuki Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/270,652

(22) Filed: Feb. 8, 2019

(65) Prior Publication Data

US 2019/0171323 A1 Jun. 6, 2019

Related U.S. Application Data

(63) Continuation of application No. 15/420,738, filed on Jan. 31, 2017, now Pat. No. 10,248,238.

(30) Foreign Application Priority Data

Feb. 8, 2016 (JP) .................................. 2016-022168

(51) Int. Cl.
*G06F 3/041* (2006.01)

(52) U.S. Cl.
CPC .................................. *G06F 3/0412* (2013.01)

(58) Field of Classification Search
CPC .................................................... G06F 3/0412
See application file for complete search history.

(56) References Cited

U.S. PATENT DOCUMENTS

| | | |
|---|---|---|
| 2008/0018583 A1 | 1/2008 | Knapp et al. |
| 2008/0088568 A1 | 4/2008 | Haga et al. |
| 2008/0266210 A1 | 10/2008 | Nonaka |
| 2010/0134743 A1* | 6/2010 | Shin .......................... G02F 1/13 349/143 |
| 2010/0289994 A1* | 11/2010 | Nonaka .............. G02F 1/133514 349/108 |
| 2012/0306844 A1 | 12/2012 | Abe et al. |
| 2014/0253419 A1 | 9/2014 | Tanada |
| 2014/0375606 A1 | 12/2014 | Abe et al. |
| 2017/0084225 A1 | 3/2017 | Nam et al. |
| 2017/0110479 A1 | 4/2017 | Chen et al. |
| 2017/0309644 A1 | 10/2017 | Yeh |
| 2017/0322446 A1 | 11/2017 | Tae et al. |

FOREIGN PATENT DOCUMENTS

| | | |
|---|---|---|
| JP | 2008-292995 A | 12/2008 |
| JP | 2012-252108 A | 12/2012 |
| JP | 2015-007925 A | 1/2015 |

* cited by examiner

*Primary Examiner* — Ariel A Balaoing
(74) *Attorney, Agent, or Firm* — Michael Best & Friedrich LLP

(57) ABSTRACT

To enable size reduction of a display device having a touch sensor function in which a display area has a non-rectangular shape. In a display area, video lines and common electrodes extend in the first direction, and scan lines extend in the second direction. A video signal transmission circuit and a common driver are arranged along a first edge of the display area, with which the one ends of the video lines are aligned. A scan line driver is arranged along a second edge of the display area, with which the ends of the scan lines and the common electrodes are aligned. The display area has a shape including an overlapping part between the first edge and the second edge. In a frame area adjacent to the overlapping part, the scan line driver is arranged more outward than the video signal transmission circuit and switch circuits.

10 Claims, 14 Drawing Sheets

DISPLAY DEVICE

CROSS-REFERENCE TO RELATED APPLICATIONS

This application is a continuation of U.S. patent application Ser. No. 15/420,738 filed on Jan. 31, 2017. Further, this application claims priority from Japanese application No. 2016-022168 filed on Feb. 8, 2016, the entire contents of which are hereby incorporated by reference into this application.

BACKGROUND OF THE INVENTION

1. Field of the Invention

The present invention relates to a display device, and in particular to a display device in which the shapes of a display area and a substrate of a display panel having a touch sensor function are not rectangular.

2. Description of the Related Art

A touch-panel built-in display panel in which a display panel is integrated with a touch panel, that is, a so-called in-cell type display device, is mounted in a variety of electronic devices.

In an active matrix display panel, for example, a scan line is arranged for every pixel row in a display area where pixels are two-dimensionally aligned in a matrix, and a video line is arranged for every pixel column so as to intersect the scan line. Further, circuits for inputting signals to the scan lines and the video lines are arranged in a frame area outside the display area on the substrate of the display panel. Specifically, a pixel row is selected in response to a signal applied to a scan line, and a video signal is inputted to the pixel selected from a video line.

Generally, the display area of a conventional display panel is rectangular, and a circuit for applying a signal to a scan line extending in the horizontal direction (the direction of a pixel row) in the display area is arranged along the left and right respective sides of the display area. A circuit for applying a video signal to a video line extending in the vertical direction (the direction of a pixel column) in the display area is arranged, for example, along the lower side of the display area.

An electrostatic capacitance type touch panel has a detection electrode and a drive electrode. A drive signal is applied to the drive electrode to detect an object, such as a finger, etc., approaching and touching the touch panel, based on an output signal from the detection electrode. In a touch panel built-in display device, a common electrode for applying common potential to the respective pixels of the display panel is divided into a plurality of portions to be used also as drive electrodes of the touch sensor. Circuits for inputting signals to the drive electrodes as well are arranged in the frame area of the substrate.

SUMMARY OF THE INVENTION

FIG. 13 is a schematic view showing a layout of an in-cell type display panel having a rectangular display area. In the rectangular display area 2, scan lines 4 are arranged extending in the horizontal direction, and video lines 6 are arranged extending in the vertical direction. FIG. 13 shows a structure in which a drive electrode extends in the vertical direction. That is, a plurality of drive electrodes 8 are arranged extending in the vertical direction in the display area, each having a width covering a plurality of pixel columns. Then, in a frame area 10, a scan circuit 12 for applying a signal to the scan line 4 is arranged along each of the left and right sides of the display area 2, and a video signal transmission line and a selector 16 for inputting a video signal from a driver IC 14 to the video line 6, and a switch circuit 18 and a shift register circuit 20 as circuits for applying a signal to the drive electrode 8 are arranged along the lower side of the display area 2. That is, as described above, circuits for supplying signals to signal lines extending in the horizontal direction in the display area 2 are arranged along a vertical side of the display area 2, with which the ends of the signal lines are aligned, while circuits for supplying signals to signal lines and electrodes extending in the vertical direction in the display area 2 are arranged along a horizontal side of the display area 2, with which the ends of the signal lines, etc., are aligned. That is, these circuits are arranged along different sides of the rectangular shape.

Usage of an in-cell type display panel has been expanded to one that does not require a rectangular display area. For example, as to an automobile speed meter, a game device, a clock, etc., the shapes of a display area and of a product may not be rectangular in view of design. FIG. 14 is a schematic diagram showing a conventional layout of an in-cell type display panel 30 having a display area not rectangular. Specifically, a display area 32 in a barrel shape whose upper and lower edges are defined as straight lines extending in the horizontal direction and left and right edges connecting the upper and lower straight edges each have an arc shape that is convex outward is shown as an example. The scan circuit 12 is arranged at a position more outward than the left and right respective ends of the display area 32 in the horizontal direction and extending, for example, straight over the entire vertical width of the display area 32. Further, the selector 16, the video signal transmission line, the switch circuit 18, and the shift register circuit 20 are arranged at positions lower than the lower end of the display area 32 and extending straight over the entire horizontal width of the display area 32. According to this layout, signal crosstalk is unlikely caused as the scan circuit 12 arranged on the left and right sides of the display area 32 does not overlap a signal line 34, etc., extending in the vertical direction, and a circuit, such as the selector 16 etc., arranged on the lower side of the display area 32 does not overlap a signal line 36, etc., extending in the horizontal direction. However, in comparison between the display panel 30 and a display panel having a rectangular display area having the same horizontal and vertical sizes as those of the display area 32, it is understood that the display panel 30 has a problem in that the display panel 30 is disadvantageous in view of size reduction and narrowing of a frame area as the size of the panel, or the substrate, of the display panel 30 is the same as that of the display panel having the rectangular display area, though the display area of the display panel 30 is smaller.

The present invention aims to reduce the size of a display device having a touch sensor function and a display area in a shape (an irregular shape) different from a rectangular shape.

(1) A display device according to the present invention is a display device having a display area and a touch sensor function in addition to a video display function, including: signal lines formed in the display area of a substrate, including a plurality of video lines extending in a first direction and a plurality of scan lines extending in a second direction intersecting the first direction; a plurality of common electrodes formed in the display area so as to extend in the first direction, for being used for video display and touch detection; a video signal transmission line arranged along a first edge among edges of a signal line laying area where the video lines and the scan lines are arranged on the substrate, for transmitting a video signal to one end of two ends of each of the video lines, the one ends being arranged on a side where the video signal transmission line is arranged, the first edge being an edge with which the one ends of the video lines are aligned; a scan circuit arranged on the substrate along a second edge among the edges of the signal line laying area, the second edge being an edge with which ends of the scan lines are aligned, for applying a scan signal to the scan line; and a common drive circuit arranged on the substrate along the first edge among the edges of the signal line laying area, for applying a reference potential signal or a touch detection signal to the common electrode via an end of the common electrode on a side of the first edge, wherein the signal line laying area has a shape including a first overlapping edge where the first edge overlaps the second edge, and in a part of a frame area positioned outside the signal line laying area on the substrate, the part adjacent to the first overlapping edge, the scan circuit is arranged more outward than the video signal transmission line and the common drive circuit.

(2) A display device according to the present invention is a display device having a display area and a touch sensor function in addition to a video display function, including: signal lines formed in the display area of a substrate, including a plurality of video lines extending in a first direction and a plurality of scan lines extending in a second direction intersecting the first direction; a plurality of common electrodes formed in the display area so as to extend in the first direction, for being used for video display and touch detection; a video signal transmission line arranged along a first edge among edges of a signal line laying area where the video lines and the scan lines are arranged on the substrate, for transmitting a video signal to one end of two ends of each of the video lines, the one ends being arranged on a side where the video signal transmission line is arranged, the first edge being an edge with which the one ends of the video lines are aligned; a scan circuit arranged on the substrate along a second edge among the edges of the signal line laying area, the second edge being an edge with which ends of the scan lines are aligned, for applying a scan signal to the scan line; and a common drive circuit arranged on the substrate along a third edge among the edges of the signal line laying area, the third edge being an edge with which other ends of the video lines are aligned, for applying a reference potential signal or a touch detection signal to the common electrode via an end of the common electrode on a side of the third edge, wherein the signal line laying area has a shape including a first overlapping edge where the first edge overlaps the second edge and a second overlapping edge where the first edge overlaps the third edge, in a part of a frame area positioned outside the signal line laying area on the substrate, the part adjacent to the first overlapping edge, the scan circuit is arranged more outward than the video signal transmission line, and in a part of the frame area adjacent to the second overlapping edge, the scan circuit is arranged more outward than the common drive circuit.

DETAILED DESCRIPTION OF THE INVENTION

Figure 1:
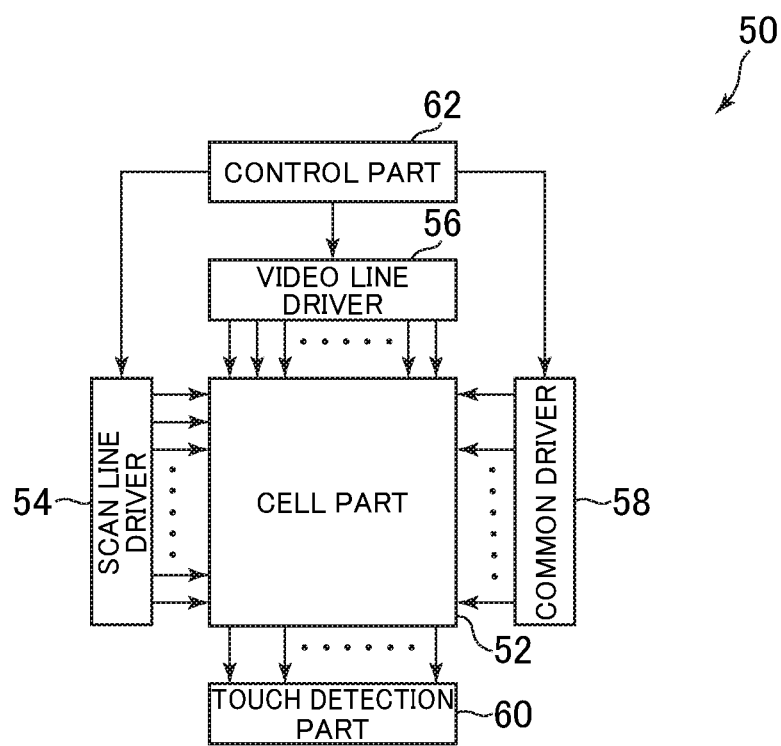
FIG. 1 is a schematic view showing a schematic structure of a display panel according to an embodiment of the present invention.

In the following, embodiments of the present invention (hereinafter referred to as embodiments) will be described based on the drawings.

Note that the disclosure relates merely to one example, and any change readily conceived while retaining the gist of the present invention by a person skilled in the art is naturally included in the scope of the present invention. Further, in the drawings, the width, thickness, shape, etc., of the respective parts may be shown schematically, compared to those according to the actual aspect, for the purpose of making the drawings clearer. The drawings merely show one example and do not limit in any way the interpretation of the present invention. In this specification and respective drawings, an element identical to one described earlier in connection with a drawing referred to earlier is given the same reference numeral, and detailed description thereof may be omitted.

First Embodiment

A display device according to the respective embodiments of the present invention is a touch panel built-in display panel 50 in which a liquid crystal display panel is integrated with an electrostatic capacitance type touch panel. FIG. 1 is a schematic diagram showing a schematic structure of a display panel 50 according to an embodiment. Note that the positions and shapes of the respective parts shown in FIG.

1 do not indicate the layout on a substrate of the display panel 50. The layout will be described later.

The display panel 50 includes a scan line driver 54, a video line driver 56, a common driver 58, a touch detection part 60, and a control part 62, besides a cell part 52 having a touch sensor function and a display function.

The cell part 52 has a structure in which a touch sensor is integrated with a liquid crystal display cell and basically corresponds to the display area of the display panel 50. The cell part 52 includes a device substrate, an opposed substrate positioned so as to oppose to the device substrate, and liquid crystal sandwiched between the device substrate and the opposed substrate.

Figure 2:
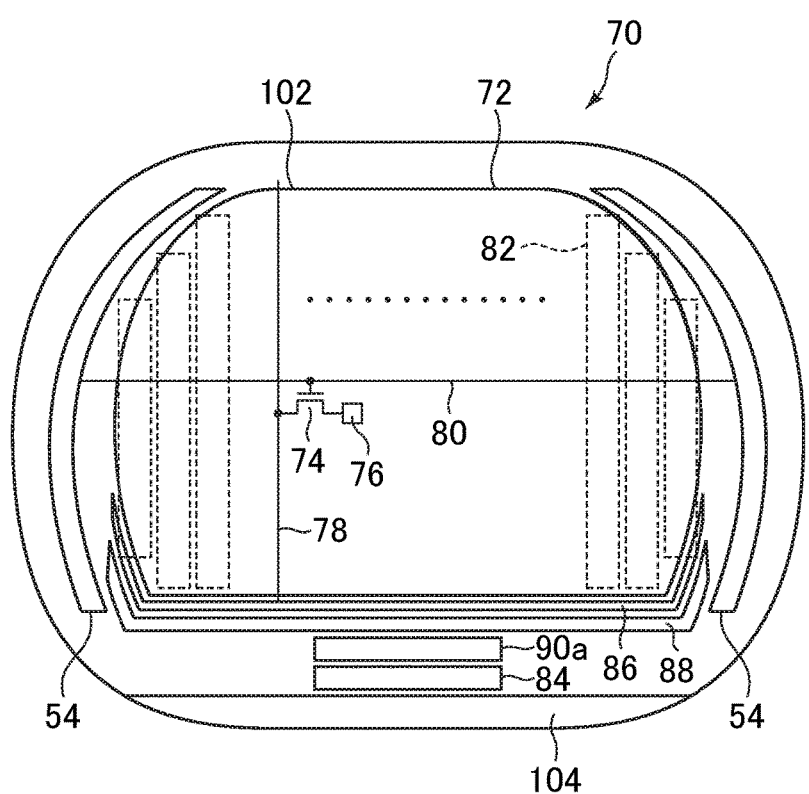
FIG. 2 is a schematic plan view of a device substrate of a display panel according to a first embodiment of the present invention.

FIG. 2 is a schematic plan view showing a device substrate 70 on which thin film transistors (TFTs) of the display panel 50 and signal lines according to the first embodiment are arranged. On the surface of a display area 72 closer to the liquid crystal, a TFT 74 and a pixel electrode 76 are formed in FIG. 2. Specifically, the pixel electrodes 76 and the TFTs 74 are arranged in a matrix so as to correspond to the pixel alignment. Note that being in a matrix refers to the alignment of pixels in a row direction and a column direction orthogonal to each other, but does not means that the shape of the entire area where the pixels are aligned is rectangular.

On the surface of the device substrate 70 closer to the liquid crystal, signal lines extending in the display area 72, namely, a plurality of video lines 78 extending in the pixel column direction and a plurality of scan lines 80 extending in the pixel row direction, are formed. The scan line 80 is provided for every pixel row, and commonly connected to the gate electrodes of the plurality of TFTs 74 in the row. Meanwhile, the video line 78 is provided for every pixel column, and commonly connected to the drains of the plurality of TFTs 74 in the column. Further, to the source of each TFT 74, a pixel electrode 76 corresponding to the TFT is connected.

The TFT 74 provided to each pixel as an active element (a switch element) is an n-channel in this embodiment, and is turned on in units of a row in response to a gate pulse that rises in the positive direction applied from the scan line 80 as a scan signal. The pixel electrode 76 is connected to the video line 78 via the TFT 74 in an on state, and receives a voltage (a pixel voltage) in accordance with the video signal from the video line 78.

In the display area 72 of the device substrate 70, a plurality of common electrodes 82 made of transparent electrode material, such as ITO (Indium-Tin-Oxide) etc., for example, similar to the pixel electrode, are arranged. Each common electrode 82 is an elongated strip electrode that is long in the pixel column direction, and arranged in the display area 72 so as to extend in the pixel column direction. For example, the common electrodes 82 each have such a width that covers the pixels in a plurality of columns, and are aligned in parallel to each other in the pixel row direction to cover the display area 72. The width of the common electrode 82, which differs depending on the resolution of the display panel 50, is generally wide enough to cover the pixels in two to thirty columns.

The common electrode 82 is used as a common electrode for applying common reference potential (common potential) to the respective pixels for the video display function of the display panel 50, and also as a drive electrode for applying a drive signal for the touch sensor function. Specifically, for the video display function, orientation of the liquid crystal is controlled for every pixel by an electric field caused in accordance with a voltage between the pixel electrode and the common electrode, to thereby change the permeability relative to the light incident from the backlight unit. With the above, an image is formed on a display surface.

Meanwhile, for the touch sensor function, the display panel 50 further includes a plurality of detection electrodes. For example, the detection electrode is formed on the opposed surface closer to the display surface which can be touched by an object, such as a finger, etc. The respective detection electrodes are arranged orthogonal to the common electrodes 82, and formed in the pixel row direction in the display area 72. The plurality of detection electrodes are aligned in parallel to each other in the pixel column direction over the entire display area 72.

For the touch sensor function, for example, an AC signal, such as a rectangular pulse, etc., for example, is inputted into the common electrode 82 to detect an electric signal generated in the detection electrode. That is, the common electrode 82 functions as a transmission electrode, while the detection electrode functions as a reception electrode. Change in voltage caused in a detection electrode due to capacitive coupling with the common electrode 82 is different between a position on the display surface touched by an object and a position not touched on the display surface. Therefore, by sequentially selecting the common electrode 82 and applying an AC signal to the common electrode 82 selected, it is possible to specify a pair of the common electrode 82 and a detection electrode corresponding to a position touched.

The scan line driver 54 is a scan circuit having a function of sequentially selecting, based on a control signal supplied from the control part 62, one horizontal line to be driven for display on the display panel 50. For example, the scan line driver 54 has a shift register having the number of stages corresponding to the number of scan lines 80, and the output terminals of the respective stages of the shift register are connected to the respective scan lines 80. Then, upon receipt of a trigger signal from the control part 62, the scan line driver 54 starts operation to sequentially select the scan line 80 according to an order along the vertical scan direction, and outputs a scan signal to the scan line 80 selected. The scan line driver 54 is arranged on the device substrate 70 as shown in FIG. 2.

The video line driver 56 receives a video signal from the control part 62, and, upon selection of a scan line 80 by the scan line driver 54, outputs a voltage in accordance with a video signal for the pixel row selected to the respective video lines 78.

Note here that the video line driver 56 can be connected to the video line 78 via a selector. The selector is connected via the input thereof to one video signal transmission line from the video line driver 56 and via the output thereof to the video lines 78 of a plurality of pixel columns, and switches by means of time sharing in response to a control signal from the control part 62 a video line 78 to which to output a video signal inputted from the video signal transmission line. For example, assume that the pixel alignment in the cell part 52 is a stripe alignment including pixels for red (R), green (G), and blue (B) in the embodiment. In this alignment, pixels of the same kind (color) are aligned in the vertical direction of an image, while RGB are cyclically aligned in the horizontal direction. Considering three adjacent pixel columns including an R pixel column, a G pixel column, and a B pixel column as one group, one selector can be provided for every group.

In FIG. 2, the video line driver 56 is built in a driver IC 84, together with the control part 62, and the video signal transmission lines (not shown) extend from the driver IC 84 to the plurality of respective selectors 86.

The common driver 58 is a drive circuit for supplying a reference potential signal and a drive signal for a touch panel to the common electrode 82, based on a control signal supplied from the control part 62. Specifically, the common driver 58 sequentially applies an AC drive signal VCOMAC as a sensor drive signal by means of time sharing to the common electrode 82 to be driven for touch detection, and also a DC drive signal VCOMDC used as a reference potential for the video display function to the other common electrodes 82. The common driver 58 includes a switch circuit 88 shown in FIG. 2, for example, and a shift register circuit 90 formed using a unit control circuit 90*a* to be described later.

Figure 3:
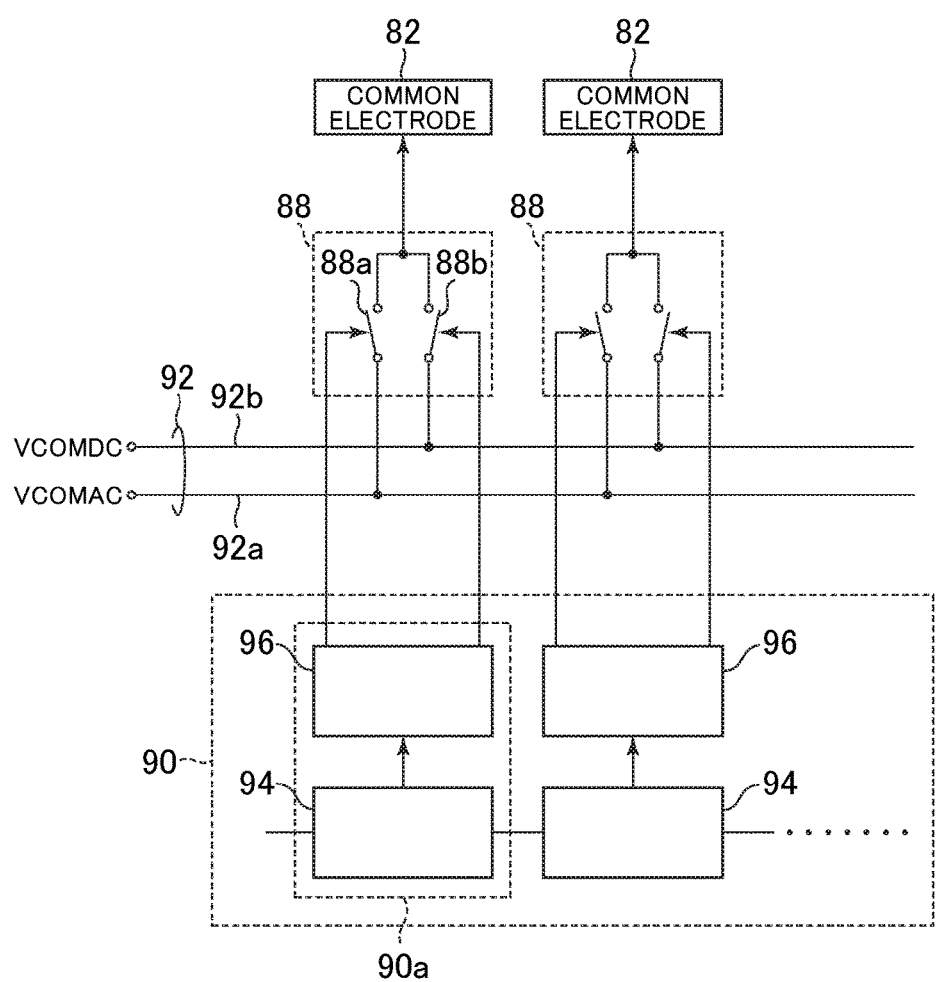
FIG. 3 is a schematic view showing a schematic structure of one example of a common driver.

FIG. 3 is a schematic view showing a schematic structure of one example of the common driver 58. The common driver 58 includes drive signal transmission lines 92 to which drive signals are supplied from the control part 62, in addition to the switch circuits 88 and the shift register circuit 90. The switch circuit 88 is provided corresponding to each common electrode 82 to switch connection between the common electrode 82 and the drive signal transmission lines 92. The shift register circuit 90 controls switching by the switch circuits 88. For example, the shift register circuit 90 has the number of unit circuits 94*s* corresponding to the number of common electrodes 82, and starts operation upon receipt of a trigger signal from the control part 62 so that the respective unit circuits 94 sequentially output a pulse. A switch drive circuit 96 is provided corresponding to each switch circuit 88, and generates a signal for controlling switching by the switch circuit 88, based on an output of the unit circuit 94. Note that a pair of a unit circuit 94 and a corresponding switch drive circuit 96 will be hereinafter referred to as a unit control circuit 90*a*.

Specifically, the drive signal transmission line 92 includes a transmission line (a VCOMAC line 92*a*) to which an AC drive signal VCOMAC is supplied from the control part 62 and a transmission line (a VCOMDC line 92*b*) to which a DC drive signal VCOMDC is supplied from the control part 62. The switch circuit 88 includes a switch 88*a* for turning on/off between the VCOMAC line 92*a* and the common electrode 82, and a switch 88*b* for turning on/off between the VCOMDC line 92*b* and the common electrode 82. The switch drive circuit 96 outputs, for example, a signal for turning on the switch 88*a* and a signal for turning off the switch 88*b* during a period with a pulse that rises to a High level (H level) potential inputted from the unit circuit 94 and a signal for tuning off the switch 88*a* and a signal for tuning on the switch 88*b* during a period with an output at a Low level (L level) potential inputted from the unit circuit 94.

Note that each switch circuit 88 can include a plurality of pairs of the switches 88*a*, 88*b*. That is, as the common electrode 82 has such a large area that covers a plurality of columns, and a transistor constituting the switch 88*a*, 88*b* is accordingly required to have a large channel width. This requirement is satisfied by providing a plurality of switches 88*a*, 88*b* in parallel, each having relatively small channel width and size.

When the vertical width of a part of the display area 72 is larger, the length and area of the common electrode 82 corresponding to the part of the display area 72 are larger, with a larger load resulted. In view of the above, the channel width of the switch 88*a*, 88*b* and the number of switches 88*a*, 88*b* provided in parallel may be accordingly increased.

The touch detection part 60 detects an object approaching and touching the display surface of the cell part 52, based on a detection signal outputted from the detection electrode provided to the cell part 52.

The control part 62 receives a video signal including a synchronizing signal, and generates a video signal indicative of a pixel value to output to the video line driver 56. Further, the control part 62 generates a control signal for having respective parts, including the scan line driver 54, the video line driver 56, the common driver 58, and the touch detection part 60, etc., to be synchronized, and outputs to these parts.

With the above described structure, the display panel 50 executes a touch detection operation, while executing a display operation.

Figure 4:
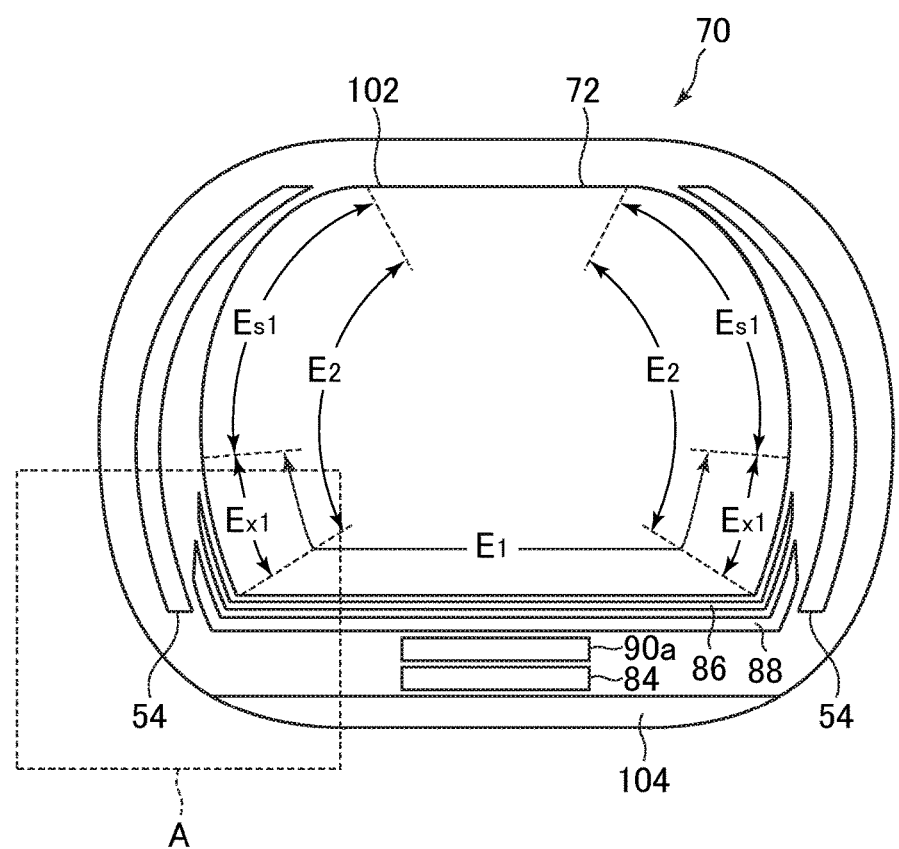
FIG. 4 is a schematic plan view showing a layout of a frame area of a device substrate of the display panel according to the first embodiment of the present invention.

Below, a layout of the device substrate 70 will be described. The display panel 50 has the display area 72 having an irregular shape, that is, not rectangular. FIG. 4 is a simpler version of FIG. 2, with a structure inside the display area 72 not shown. In FIG. 4 (or FIG. 2), the display area 72 having a barrel shape whose upper and lower edges are straight lines extending in the horizontal direction and left and right edges that connect the upper and lower straight edges each have an arc shape that is convex outward is shown as an example. The present invention aims to implement a narrower frame area of the device substrate 70 with respect to the display area 72 having an irregular shape to thereby reduce the size of the display panel 50. As a result of a narrower frame area, the device substrate 70 has a shape not rectangular but a shape similar to that of the display area 72, as shown in FIG. 2. The narrower frame area and size reduction is achieved by changing a layout of the circuits and lines arranged in the frame area.

Note here that the circuits and lines in the frame area are arranged basically outside the laying area (a signal line laying area) of the video line 78 and the scan line 80 formed in the cell part 52. In view of the above, positioning the ends of the video lines 78 and the scan lines 80 formed in the display area 72 so as to be basically aligned with the respective edges of the display area 72 contributes to a narrower frame area. This is similarly applied to the common electrode 82. That is, the ends of the common electrodes 82 are positioned basically aligned with an edge of the display area 72.

Figure 5:
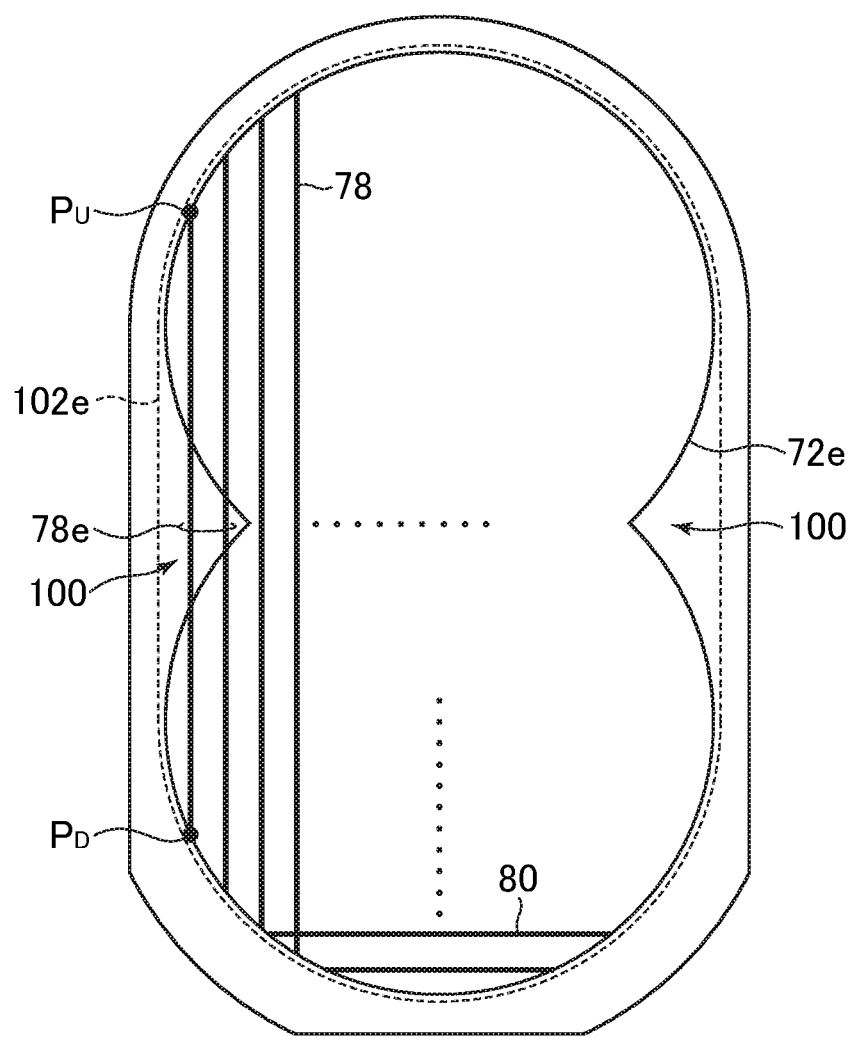
FIG. 5 is a schematic plan view of a device substrate, showing an example in which a display area does not coincide with a signal line laying area.

With the video line 78 and the scan line 80 extending from one end to the other end of the display area 72, in a case such as is shown in FIGS. 2 and 4, a signal line laying area 102 where the video line 78 and the scan line 80 are arranged is basically shaped similar to the display area 72. However, in the case where a display area 72*e* has a valley portion 100, such as is shown in FIG. 5, the shape of a signal line laying area 102*e* may not coincide with that of the display area 72*e*. This is because, in the example shown in FIG. 5, the valley portion 100 as well is included in the signal line laying area 102*e* as the video line 78*e* is formed between the upper end $P_U$ and the lower end $P_D$ of the display area 72 at the horizontal position where the video line extends. In conclusion, the shape of the signal line laying area may not always coincide with that of the display area 72, but can have a larger area than the display area 72, though the signal line laying area is basically defined coincident with the display area 72 for the purpose of implementing a narrower frame area.

Note here that the position of a circuit etc., in the frame area is expressed in correlation with a position along an edge of the signal line laying area 102. Assume that, as shown in FIG. 4, a part of the edges of the signal line laying area 102 with which the lower ends of the video lines 78 and the common electrode 82 are aligned is referred to as a first edge $E_1$, and another part of the same with which the ends of the scan lines 80 are aligned is referred to as a second edge $E_2$. The display area 72 has a shape including a part where the first edge $E_1$ overlaps the second edge $E_2$. This overlapping part is referred to as a first overlapping edge $E_{x1}$, and a part of the second edge $E_2$ excluding the first overlapping edge $E_{x1}$ is referred to as a non-overlapping edge $E_{s1}$.

Figure 6:
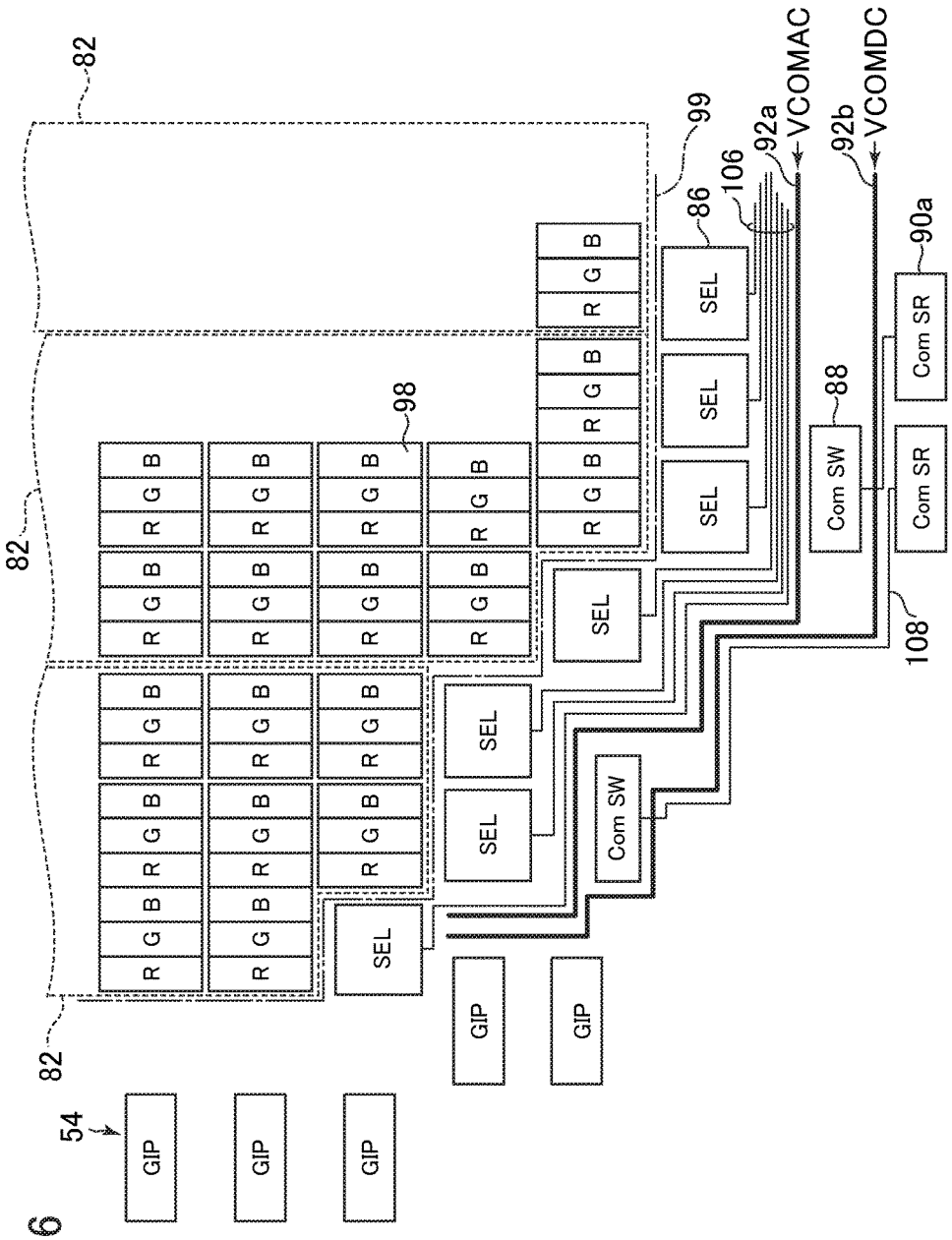
FIG. 6 is a schematic plan view showing a layout of a frame area in a lower left part of a device substrate.

The driver IC 84 is arranged in the frame area along the first edge $E_1$, that is, in the frame area on the lower side of the display area 72 of the device substrate 70 shown in FIG. 4. Note that a terminal is arranged in a terminal area 104 ensured in the lower end portion of the device substrate 70, and the driver IC 84 is connected to an external circuit via the terminal. A group of video signal transmission lines 106 for sending a video signal from the video line driver 56 built in the driver IC 84 to the video lines 78 are laid in an area along the first edge $E_1$, as shown in FIG. 6 to be described later. In particular, the video signal transmission line 106 directed to the video line 78 positioned apart from the driver IC 84 in the horizontal direction extends along the first edge $E_1$. In this embodiment, the video signal transmission line 106 is connected to three video lines 78 corresponding to the R pixel column, the G pixel column, and the B pixel column, respectively, via the selector 86. As shown in FIG. 6, each selector 86 is arranged in a position close to the lower ends of the three video lines 78 to which the selector 86 is connected, and the video signal transmission line 106 is connected to the selector 86. Thus, the selector 86 is aligned between the video signal transmission line 106 and the signal line laying area 102 along the first edge $E_1$ with which the lower ends of the video lines 78 are aligned. Also, the common driver 58 as well can be arranged along the first edge $E_1$ on the device substrate 70.

While the first edge $E_1$ has a non-linear shape, arranging the selector 86, the video signal transmission line 106, and the common driver 58 along the non-linear shaped first edge $E_1$ can implement a narrower frame area.

The scan line driver 54 is arranged on the device substrate 70 along the second edge $E_2$. While the second edge $E_2$ has a non-linear shape, arranging the scan line driver 54 along the non-linear shaped second edge $E_2$ can implement a narrower frame area.

Specifically, as shown in FIG. 6, the scan line driver 54 is arranged such that the respective stages of the shift register thereof are arranged along the second edge $E_2$. With the above, the non-straight layout of the scan line driver 54 shown in FIG. 4 is achieved.

Note that in order to reduce influence of deteriorated pulse in the scan line 80, the scan line driver 54 is arranged on each of the left and right sides of the display area 72 to supply a signal from the respective both ends of the scan line 80. For example, basically, a symmetrical circuit layout can be implemented for the frame area on the left and right respective sides of the display area 72.

This, however, may not be applicable to a display panel having a display area 72 in a smaller size, and the scan line driver 54 may be arranged only on one side of the display area 72.

Note here that the display area 72 has a shape that includes the first overlapping edge $E_{x1}$ between the first edge $E_1$ and the second edge $E_2$ of the signal line laying area 102, as described above. In a part of the frame area adjacent to the first overlapping edge $E_{x1}$, the scan line driver 54 is arranged more outward than the video signal transmission line 106 and the common driver 58.

Note here that the unit control circuit 90a of the shift register circuit 90 and the switch circuit 88 are provided as the common driver 58 for every common electrode 82. In this embodiment, as shown in FIG. 6, a plurality of switch circuits 88 among the circuits constituting the common driver 58 are arranged at positions corresponding to arrangement of the common electrodes 82 in the horizontal direction, and along the first edge $E_1$, and further, a drive signal transmission line 92 as well for transmitting a drive signal to the respective switch circuits 88 is arranged extending along the first edge $E_1$. Meanwhile, the unit control circuit 90a is arranged in the frame area along the non-overlapping edge $E_{S1}$, and as shown in FIG. 6, a switch control line 108 extending from the unit control circuit 90a to each switch circuit 88 is arranged extending along the first edge $E_1$. That is, the switch circuit 88, the drive signal transmission line 92, and the switch control line 108 among the structural components constituting the common driver 58 are arranged basically along the entire first edge $E_1$ in this embodiment.

Also, in this embodiment, the selector 86 arranged between the video signal transmission line 106 and the signal line laying area 102 is aligned basically along the entire first edge $E_1$. In the example shown in FIG. 6, sequentially from the side of the signal line laying area 102 toward the edge of the device substrate 70, the selector 86, the video signal transmission line 106, the switch circuit 88, the switch control line 108, and the scan line driver 54 are arranged in the frame area along the first overlapping edge $E_{x1}$.

The scan line driver 54 includes a shift register, and uses a clock signal for the operation of the shift register. Arranging the above described video signal transmission line 106 so as to be closer to the signal line laying area 102 than the scan line driver 54 can prevent crosstalk from the clock signal line to the video signal as the line for transmitting a video signal does not intersect the clock signal line of the scan line driver 54.

FIG. 6 is a schematic view showing in detail a layout of the circuits etc., in the frame area, being specifically a schematic plan view showing enlarged a lower left part of the device substrate 70 (the part enclosed by the frame line A in FIG. 4).

In FIG. 6, the edge 99 of the signal line laying area 102 is indicated by the alternate long and short dash line surrounding the display area 72 where the pixels 98 are aligned. FIG. 6 further shows an example of arrangement of the scan line driver 54 and the common driver 58 in a range corresponding to five pixel rows from the bottom along the second edge $E_2$ on the left side of the signal line laying area 102, and an example of arrangement of seven leftmost selectors 86 among those arranged along the first edge $E_1$. In FIG. 6, a block "SEL" indicates the selector 86, in which four leftmost selectors 86 are arranged in a part (the first overlapping edge $E_{x1}$) where the first edge $E_1$ overlaps the second edge $E_2$; a block "GIP" indicates the scan line driver 54, basically corresponding to a circuit for one stage of a shift register of the scan line driver 54; a block "ComSR" indicates the unit control circuit 90a, or a circuit for one stage of a shift register of the shift register circuit 90; and a "ComSW" indicates the switch circuit 88.

Note that although the common electrode 82 having a width covering three pixels is shown as an example for convenience in FIG. 6, generally, the common electrode 82 is formed having a width corresponding to two to thirty columns, as described above. "ComSR" and "ComSW" are provided corresponding to the common electrode 82 as shown in FIG. 6.

The VCOMAC line 92a and the VCOMDC line 92b are arranged extending from the control part 62 along the first edge $E_1$ with the switch circuit 88 in-between, as shown in FIG. 6. Note that although the VCOMAC line 92a is arranged on the side of the video signal transmission line 106 relative to the switch circuit 88 and the VCOMDC line 92b on the side of the scan line driver 54 relative to the switch circuit 88 in FIG. 6, the VCOMAC line 92a and the VCOMDC line 92b may be positioned opposite from the above.

Figure 14:
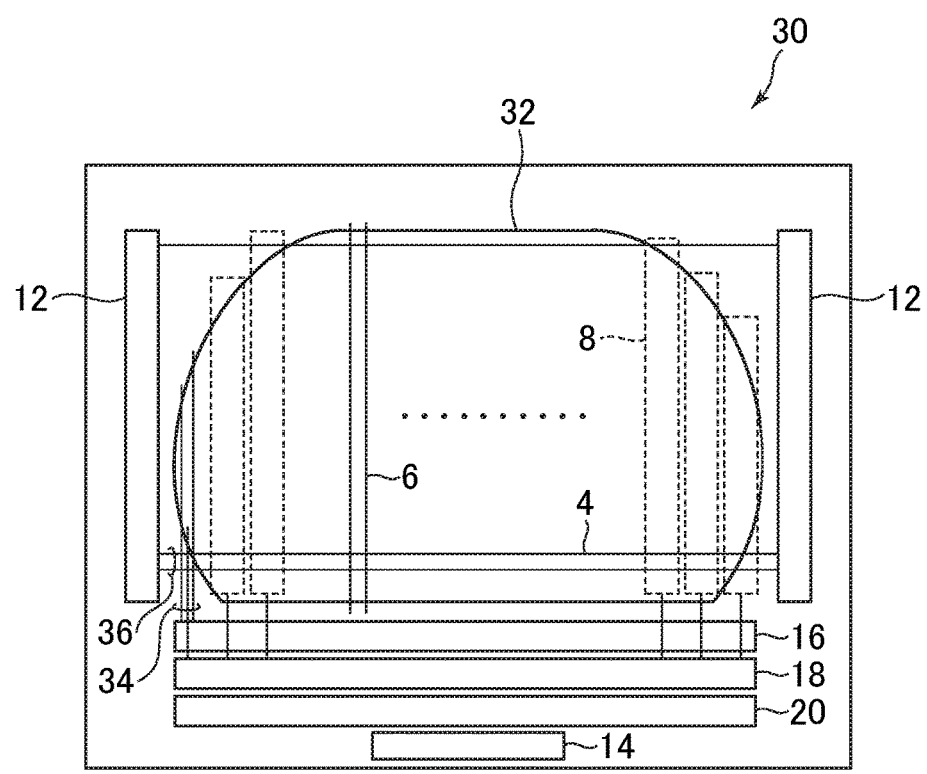
FIG. 14 is a schematic view showing a conventional layout of an in-cell type display panel having a display area not rectangular.

In the case where the signal line laying area 102 has a shape that is convex in the horizontal direction on the second edge thereof, like the display area 72 having a barrel shape according to this embodiment, use of a rectangular substrate as shown in FIG. 14 results in a problem in that, although the distance between the second edge of the signal line laying area and the edge of the substrate, that is, the width of the frame area, can be made shorter at the protruding end of the convex portion of the signal line laying area, the distance becomes longer as it goes closer to a corner of the rectangular substrate. On the contrary, according to the layout of a circuit etc., on the left and right respective sides of the signal line laying area 102 according to the above described embodiment, it is not necessary to employ a rectangular substrate, and it is possible to employ a device substrate having a shape that is convex in the horizontal direction, similar to that of the signal line laying area 102. For example, the device substrate 70 can have a shape in which the distance between any point on the second edge $E_2$ and the edge of the substrate is equal to or shorter than the corresponding distance at the protruding end of the second edge $E_2$ in the horizontal direction.

Second Embodiment

A display panel 50 according to a second embodiment of the present invention will be described mainly referring to a difference from the above described first embodiment. The display panel 50 includes a display area 72 and a device substrate 70 both having an irregular shape, similar to the first embodiment.

Figure 7:
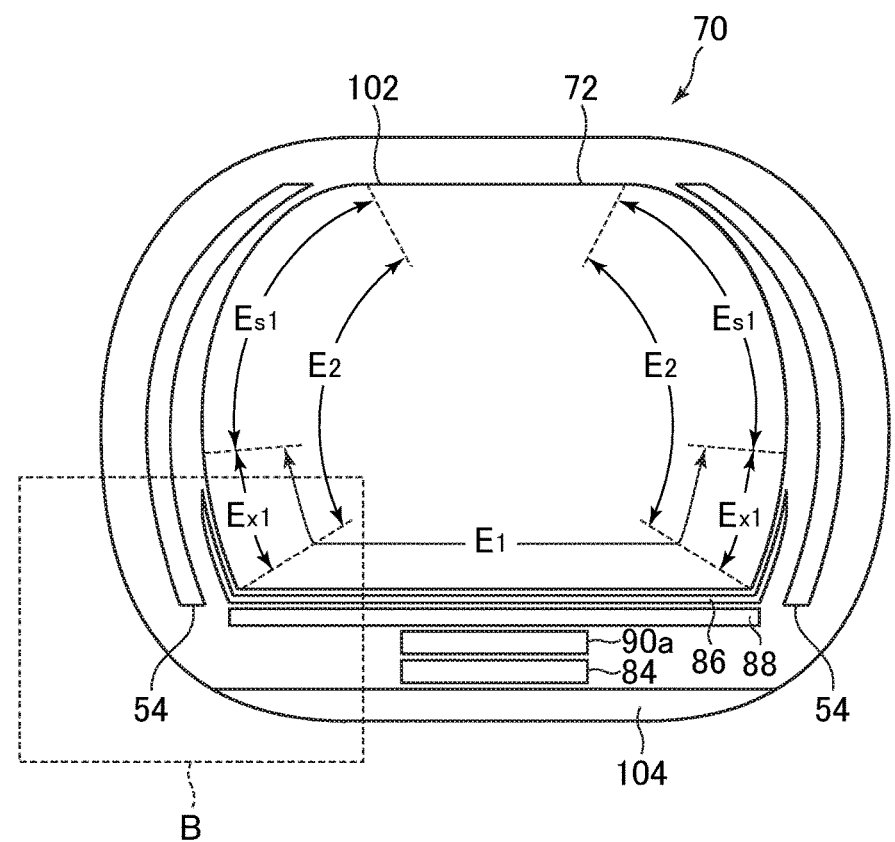
FIG. 7 is a schematic plan view of a device substrate of a display panel according to a second embodiment of the present invention.

FIG. 7 is a schematic plan view showing the device substrate 70 of the display panel 50 according to the second embodiment, with a structure inside the display area 72 not shown, similar to FIG. 4. In this embodiment as well, similar to the above describe first embodiment, the common driver 58 is arranged along the first edge $E_1$. A basic difference from the first embodiment is that, of the structural components of the common driver 58, the switch circuit 88, in addition to the unit control circuit 90a, is arranged in the frame area only along the non-overlapping edge $E_{S1}$. The common driver 58 has a drive signal distribution line extending along the first edge $E_1$, for connecting each switch circuit 88 to a corresponding common electrode 82, so that a drive signal is supplied from the switch circuit 88 to the common electrode 82 via the drive signal distribution line. That is, the drive signal distribution line provided to the common driver 58 is arranged extending basically along the entire first edge $E_1$.

Figure 8:
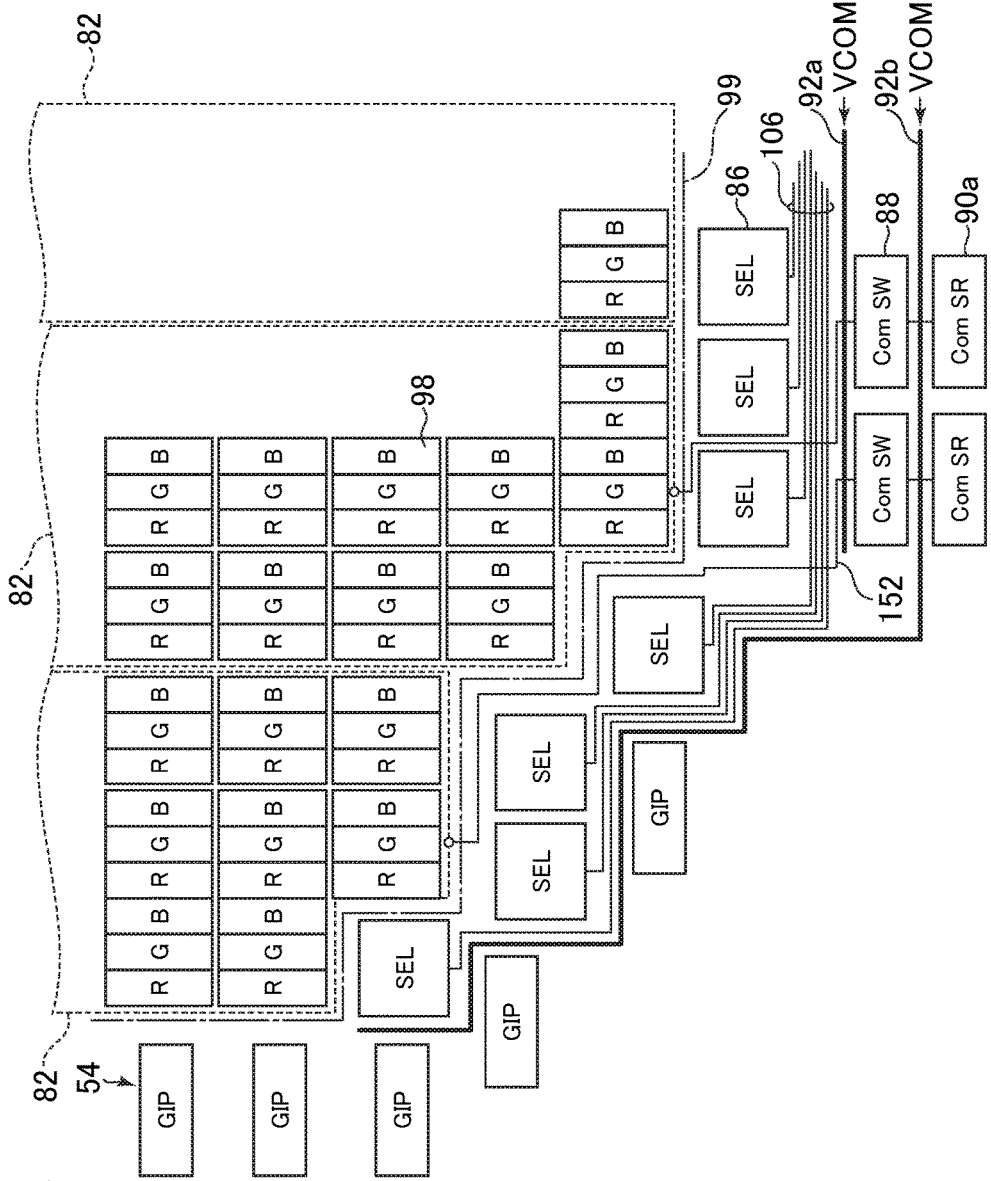
FIG. 8 is a schematic view showing a layout in a lower left part of a device substrate according to the second embodiment of the present invention.

FIG. 8 is a schematic diagram showing a layout of the unit control circuit 90a, the switch circuit 88, and a drive signal distribution line 152, specifically, showing a layout in a left lower part (the part enclosed by the frame line B in FIG. 7) of the device substrate 70. Although a switch circuit 88 corresponding to each common electrode 82 is arranged basically adjacent to the common electrode 82 in the first embodiment, the switch circuit 88 corresponding to the common electrode 82 having an end aligned with the first overlapping edge $E_{x1}$ is arranged at a position relatively apart from the common electrode 82 and a drive signal distribution line 152 for transmitting a drive signal from the switch circuit 88 to the common electrode 82 is arranged extending along the first edge $E_1$ in this embodiment. The drive signal distribution line 152 extends, for example, between the selector 86 and the edge 99 of the signal line laying area 102. Note that, in this embodiment, the VCOMDC line 92b extends from the non-overlapping edge $E_{S1}$ along which the switch circuit 88 is arranged and laid between the scan line driver 54 and the video signal transmission line 106 in an area along the first overlapping edge $E_{x1}$. An extension portion of the VCOMDC line 92b functions as a shield for preventing noise jump from the scan line driver 54 to the video signal transmission line 106.

Therefore, in the example shown in FIG. 8, the drive signal distribution line 152, the selector 86, the video signal transmission line 106, the VCOMDC line 92b, and the scan line driver 54 are arranged in the frame area along the first overlapping edge $E_{x1}$, sequentially from the side of the signal line laying area 102 toward the edge of the device substrate 70.

Third Embodiment

A display panel 50 according to a third embodiment of the present invention will be described mainly referring to a difference from the above described first embodiment. The display panel 50 includes a display area 72 and a device substrate 70 both having an irregular shape, similar to the first embodiment.

Figure 9:
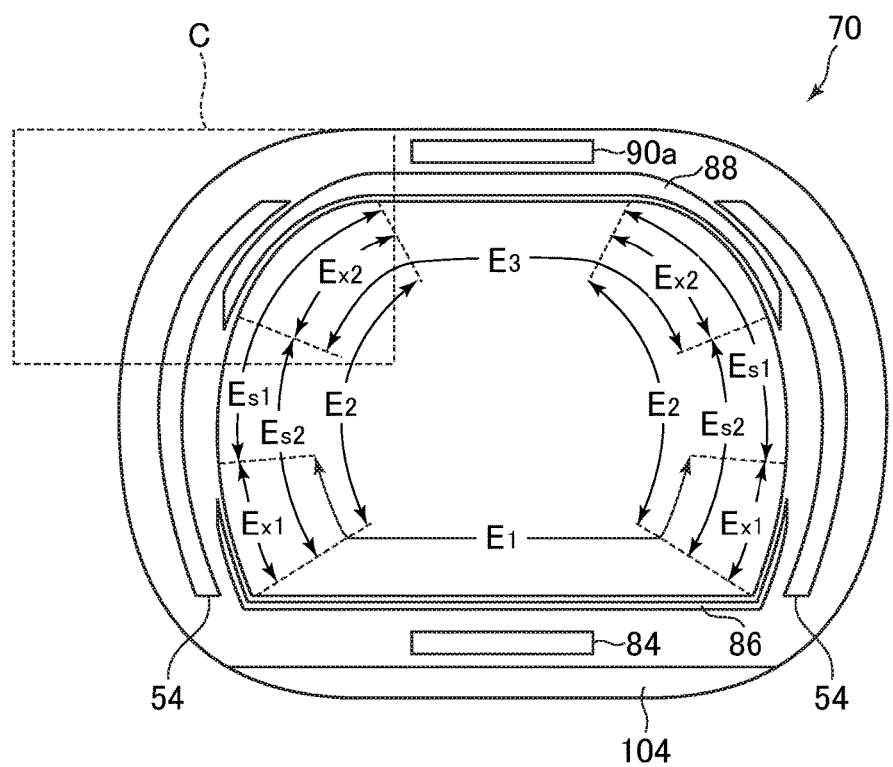
FIG. 9 is a schematic plan view of a device substrate of a display panel according to a third embodiment of the present invention.

FIG. 9 is a schematic plan view showing the device substrate 70 of the display panel 50 according to the third embodiment, with a structure inside the display area 72 not shown, similar to FIG. 4.

The driver IC 84, the video signal transmission line 106, and the selector 86 are arranged in the frame area along the first edge $E_1$. Meanwhile, the common driver 58 is arranged in the frame area along one (the third edge $E_3$) of the edges of the signal line laying area 102, with which the upper ends of the video lines 78 and the common electrodes 82 are aligned, and applies a sensor drive signal to the common electrode 82 via the end of the common electrode 82 closer to the third edge $E_3$.

The display area 72 has a shape including a part (the first overlapping edge $E_{x1}$) where the first edge $E_1$ of the signal line laying area 102 overlaps the second edge $E_2$, and a part (the second overlapping edge $E_{x2}$) where the first edge $E_1$ overlaps the third edge $E_3$. The first edge $E_1$ is non-straight, and arranging the selector 86 and the video signal transmission line 106 along the non-straight first edge $E_1$ can implement a narrower frame area. Further, the third edge $E_3$ is non-straight, and arranging the common driver 58 along the non-straight third edge $E_3$ can implement a narrower frame area. Still further, as described in the first embodiment, arranging the scan line driver 54 along the non-straight second edge $E_2$ can implement a narrower frame area.

In a part of the frame area adjacent to the first overlapping edge $E_{x1}$, the scan line driver 54 is arranged at a position more outward than the video signal transmission line 106. Also, in a part of the frame area adjacent to the second overlapping edge $E_{x2}$, the scan line driver 54 is arranged at a position more outward than the common driver 58.

Figure 10:
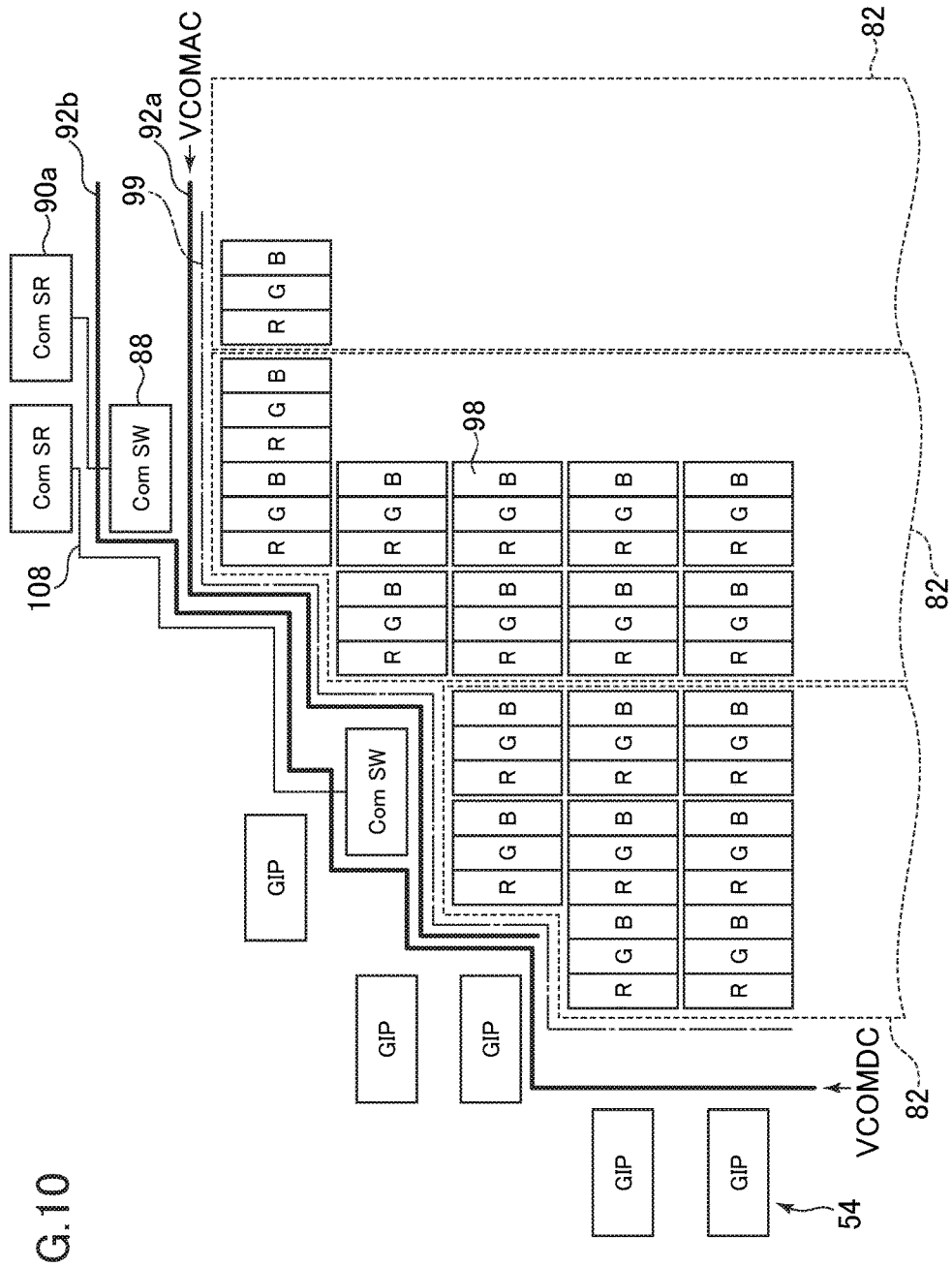
FIG. 10 is a schematic view showing a layout in an upper left part of the device substrate according to the third embodiment of the present invention.

FIG. 10 is a schematic view showing a layout of the unit control circuit 90a, the switch circuit 88, and the switch control line 108, specifically showing a layout in a left upper part of the device substrate 70 (the part enclosed by the frame line C in FIG. 9). In this embodiment, a plurality of switch circuits 88 among the circuits constituting the common driver 58 are aligned at positions corresponding to arrangement of the common electrodes 82 in the horizontal direction, and along the third edge $E_3$. Further, the drive signal transmission line 92 for sending a drive signal to each switch circuit 88 as well extends along the third edge $E_3$. Meanwhile, the unit control circuit 90a is arranged in the frame area in a part (the non-overlapping edge $E_{S2}$) of the third edge $E_3$ excluding the second overlapping edge $E_{x2}$, and a switch control line 108 is arranged extending from the unit control circuit 90a to each switch circuit 88 along the third edge $E_3$.

That is, among the structural components of the common driver 58, the switch circuit 88, the drive signal transmission line 92, and the switch control line 108 are arranged extending basically along the entire third edge $E_3$. In the example shown in FIG. 10, in the frame area along the second overlapping edge $E_{x2}$, the switch circuit 88, the switch control line 108, and the scan line driver 54 are arranged, sequentially from the side of the signal line laying area 102 toward the edge of the device substrate 70.

As shown in FIG. 10, the VCOMAC line 92a and the VCOMDC line 92b are arranged along the third edge $E_3$ with the switch circuit 88 in-between. In FIG. 10, the VCOMAC line 92a is arranged on the side of the signal line laying area 102 relative to the switch circuit 88, and the VCOMDC line 92b is arranged on the side of the scan line driver 54 relative to the switch circuit 88. However, the positions of the VCOMAC line 92a and the VCOMDC line 92b may be opposite from those described above. Note that the VCOMAC line 92a and the VCOMDC line 92b extend from the control part 62 arranged in the lower part of the device substrate 70 and extends in the frame area along the second edge $E_2$ to supply a drive signal to the switch circuit 88 arranged in the upper part of the device substrate 70. Similarly, lines for supplying a trigger signal or a clock signal from the control part 62 to the shift register circuit 90 are provided.

The VCOMAC line 92a and the VCOMDC line 92b can be arranged both extending along one second edge $E_2$ of the signal line laying area 102. Alternatively, the VCOMAC line 92a and the VCOMDC line 92b can be led to the third edge $E_3$ of the signal line laying area 102 via different routes, like, for example, the VCOMAC line 92a arranged along the second edge $E_2$ on the right side of the signal line laying area 102 and the VCOMDC line 92b arranged along the second edge $E_2$ on the left side of the signal line laying area 102. FIG. 10 shows arrangement of the drive signal transmission line 92 in an upper left part of the device substrate 70 in this case.

Fourth Embodiment

A display panel 50 according to a fourth embodiment of the present invention will be described by referring mainly to difference from the above described respective embodiments. Similar to the above described respective embodiments, the display panel 50 includes a display area 72 and a device substrate 70 both having an irregular shape.

Figure 11:
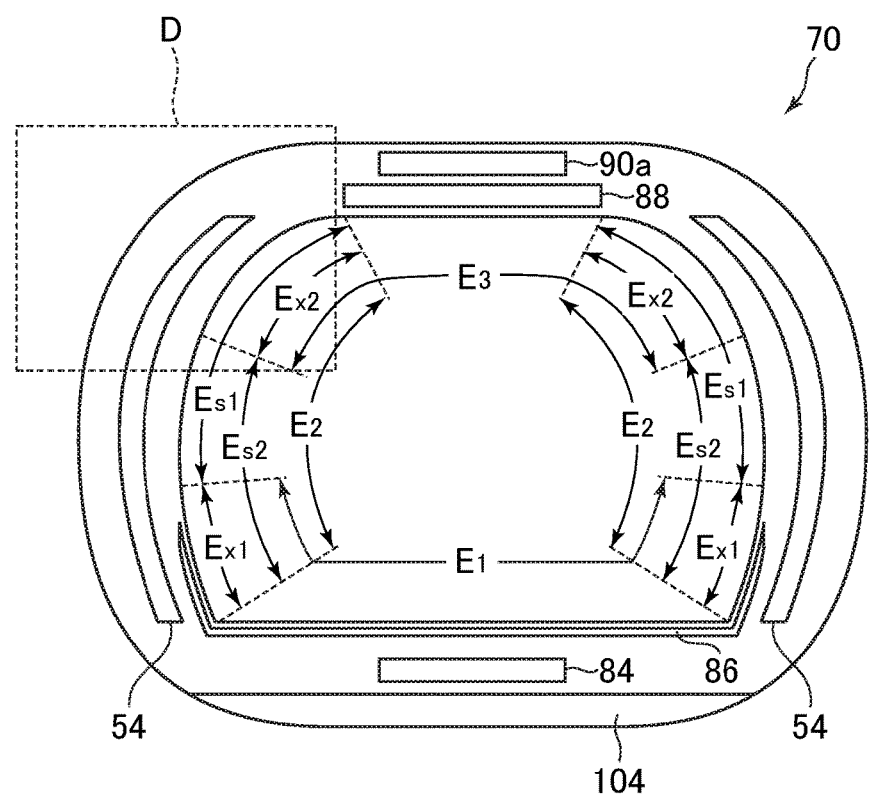
FIG. 11 is a schematic plan view of a device substrate of a display panel according to a fourth embodiment of the present invention.

FIG. 11 is a schematic plan view of a device substrate 70 of the display panel 50 according to the fourth embodiment, of which structure inside the display area 72 is not shown, similar to FIG. 9. In this embodiment as well, similar to the above described third embodiment, the common driver 58 is arranged along the third edge $E_3$. A basic difference from the third embodiment lies in that the switch circuit 88, in addition to the unit control circuit 90a, among the structural components of the common driver 58 is arranged in the frame area only along the non-overlapping edge $E_{S2}$. The common driver 58 has a drive signal distribution line extending along the third edge $E_3$, for connecting each switch circuit 88 to a corresponding common electrode 82, and a drive signal is supplied from the switch circuit 88 to the common electrode 82 via the drive signal distribution line. That is, the drive signal distribution line provided to the common driver 58 is arranged extending basically along the entire third edge $E_3$.

Figure 12:
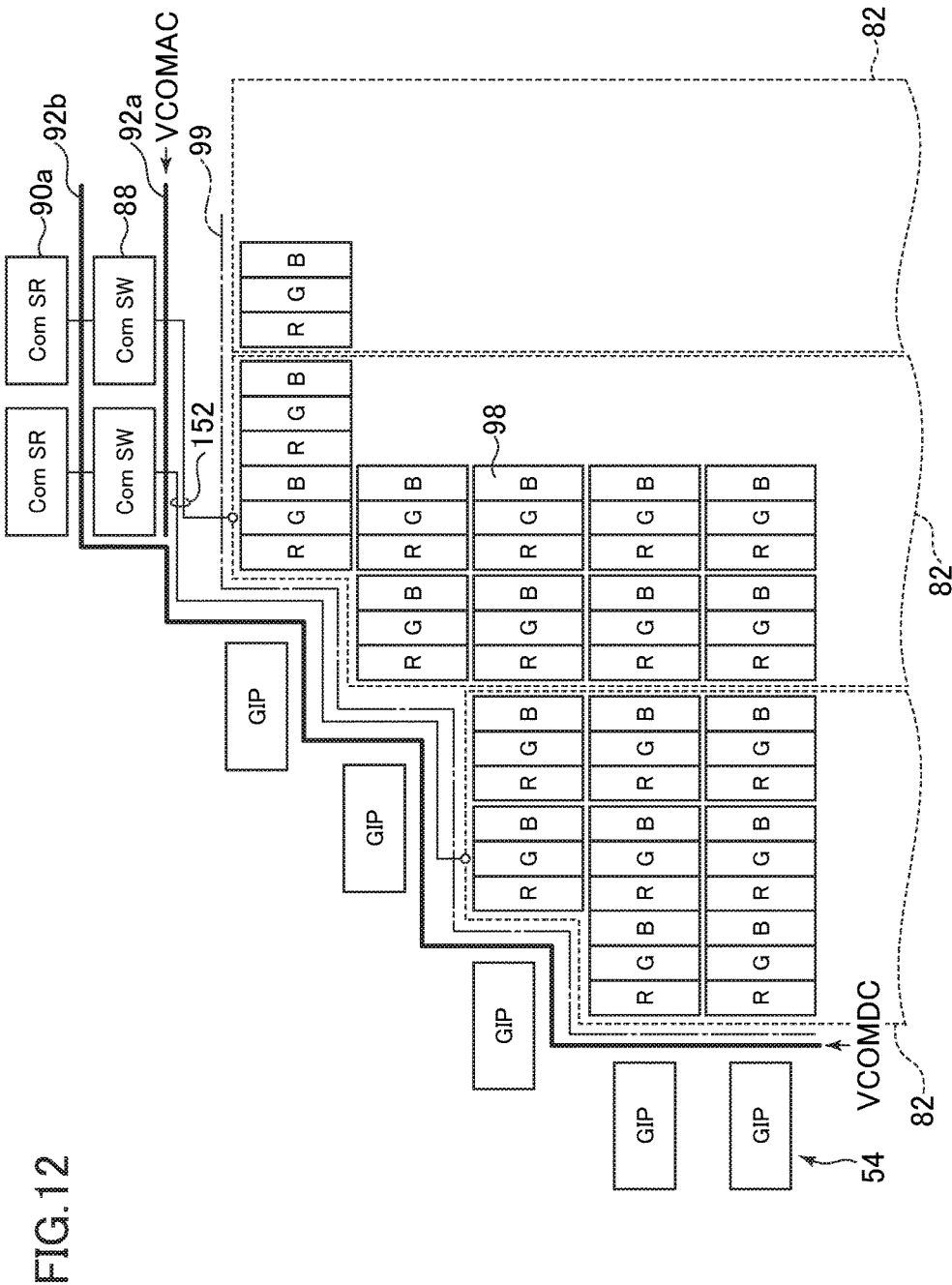
FIG. 12 is a schematic view showing a layout in an upper left part of the device substrate according to the fourth embodiment of the present invention.
Figure 13:
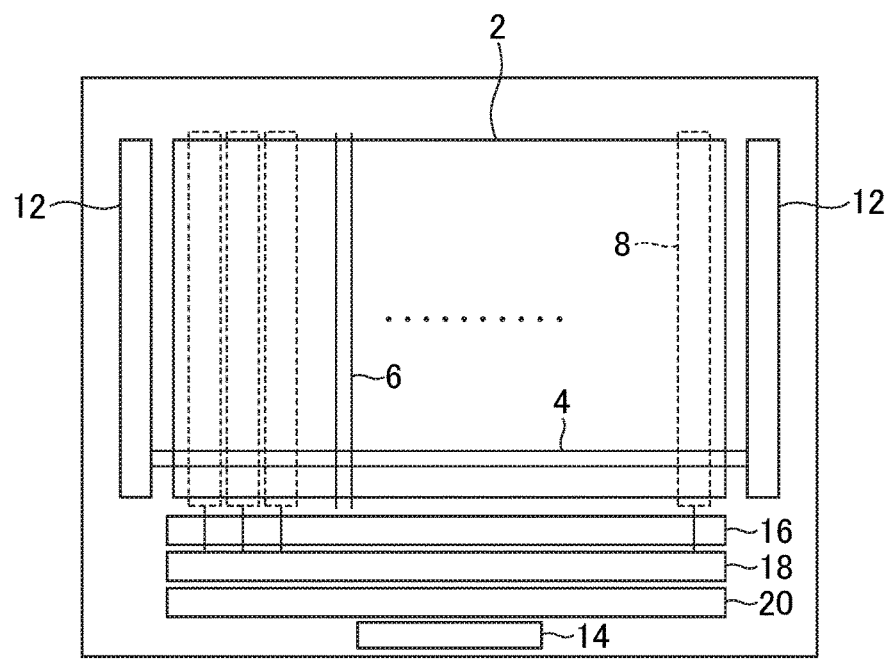
FIG. 13 is a schematic view showing a layout of a conventional in-cell type display panel.

FIG. 12 is a schematic view showing a layout of the shift register circuit 90, the switch circuit 88, and the drive signal distribution line 152, showing a layout in an upper left part (the part enclosed by the frame line D in FIG. 11) of the device substrate 70. Although the switch circuit 88 corresponding to each common electrode 82 is arranged basically adjacent to the common electrode 82 in the third embodiment, the switch circuit 88 corresponding to the common electrode 82 having an end portion aligned with the second overlapping edge $E_{x2}$ is arranged relatively apart from the common electrode 82, and a drive signal distribution line 152 for transmitting a drive signal from the switch circuit 88 to the common electrode 82 is arranged extending along the third edge $E_3$. The drive signal distribution line 152 extends between the scan line driver 54 and the signal line laying area 102.

Other Embodiments

Although each switch circuit 88 of the common driver 58 is arranged adjacent to the corresponding common electrode 82, and the shift register circuit 90 is not arranged along the first overlapping edge $E_{x1}$ or the second overlapping edge $E_{x2}$ in the above described first and third embodiments, the switch drive circuit 96 or a pair of the switch drive circuit 96 and the unit circuit 94 corresponding to each switch circuit 88 may be arranged adjacent to the common electrode 82.

Although a structure in which the common electrode 82 is used as a common electrode for applying a reference potential for the video display function and also as a drive electrode for applying a drive signal for the touch sensor function has been described in the above described respective embodiments, the present invention can be applied to a structure in which a common electrode and a drive electrode are independently provided.

Also, although the display area 72 having a barrel shape whose upper and lower edges are straight is described as an example in the above described respective embodiments, the entire shape of the display area 72 may be round, and the concept of the circuit layout of the present invention can be similarly applicable.

Although an example in which a display device is a liquid crystal display panel has been described in the above described respective embodiments, other types of display panel may be similarly applicable. For example, an organic electroluminescence (EL) display device may be applicable. An organic EL display device has a lower electrode and an upper electrode for applying a voltage to an organic light emitting layer. For example, the lower electrode is formed for every pixel, and the upper electrode is formed as a common electrode. The common electrode can be used also as a drive electrode of a touch sensor.

In the above, embodiments of the present invention have been described. Note here that it is understood that a person skilled in the art can conceive various examples of changes and modifications within the scope of the concept of the present invention, and that those examples of changes and modifications as well are included in the scope of the present invention. For example, any addition, deletion, or design change of a structural component, addition or omission of a step, or change in condition that is desirably made by a person skilled in the art relative to the above described respective embodiments as well is included in the scope of the present invention as long as those include the gist of the present invention.

It is naturally understood that any effect obvious from the description of this specification or desirably conceivable by a person skilled in the art among other effects achieved according to the aspects described in connection with the embodiments is achieved according to the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device having a touch sensor function in addition to a video display function, comprising:
    signal lines formed in a display area of a substrate, including a plurality of video lines extending in a first direction and a plurality of scan lines extending in a second direction intersecting the first direction;
    a plurality of common electrodes formed in the display area so as to extend in the first direction, for being used for video display and touch detection;
    a plurality of video signal transmission lines arranged along a first edge among edges of a signal line laying area where the video lines and the scan lines are arranged on the substrate;
    a plurality of scan circuits arranged on the substrate along a second edge among the edges of the signal line laying area, for applying a scan signal to the scan line; and
    a common electrode signal transmission line arranged on the substrate along the first edge among the edges of the signal line laying area, for applying a reference potential signal or a touch detection signal to the common electrode,
    wherein
    the signal line laying area has a shape including a first overlapping edge where the first edge overlaps the second edge, and
    in a part of a frame area positioned outside the signal line laying area on the substrate, the video signal transmission line and the common electrode signal transmission line are disposed between the signal line laying area and the scan circuit.

2. The display device according to claim 1, wherein
    the common electrode signal transmission line includes
    a first drive signal transmission line to which the touch detection signal is supplied, and
    a second drive signal transmission line to which the reference potential signal is supplied,
    the first edge has a common drive circuit,
    the common drive circuit includes
    a plurality of switch circuits provided each corresponding to each of the plurality of common electrodes and aligned along the first edge so as to correspond to arrangement of the plurality of common electrodes in the second direction, for switching connection between the each common electrode and the first or second drive signal transmission line,
    a switch control circuit arranged in the frame area in a non-overlapping part of the first edge excluding the first overlapping edge, for controlling switching by the switch circuit, and
    a switch control line extending from the switch control circuit to the each switch circuit along the first edge.

3. The display device according to claim 1, wherein
    the common electrode signal transmission line includes
    a first drive signal transmission line to which the touch detection signal is supplied, and
    a second drive signal transmission line to which the reference potential signal is supplied,
    the first edge has a common drive circuit,
    the common drive circuit includes
    a plurality of switch circuits provided each corresponding to each of the plurality of common electrodes and arranged in the frame area in a non-overlapping part of the first edge, among the edges of the signal line laying area, excluding the first overlapping edge, for switching connection between the each common electrode and the first drive signal transmission line or the second drive signal transmission line,
    a switch control circuit arranged in the frame area in the non-overlapping part, for controlling switching by the switch circuit, and
    a drive signal distribution line extending from the switch circuit to the each common electrode along the first edge.

4. The display device according to claim 1, wherein
    the video signal transmission line is provided for every group obtained by dividing the plurality of video lines into groups each including a plurality of adjacent video lines, and
    the display device further comprises a selector that is a circuit arranged between the video signal transmission line and the first edge, and connected, for every group, via an input thereof to the video signal transmission line, and via an output thereof to the video lines of the group.

5. The display device according to claim 1, wherein
    the signal line laying area has a shape that is arcuate at least at a part of the second edge, and
    the substrate has an end shape along the second edge of the signal line laying area at a portion adjacent to the second edge.

6. A display device having a touch sensor function in addition to a video display function, comprising:
    signal lines formed in a display area of a substrate, including a plurality of video lines extending in a first direction and a plurality of scan lines extending in a second direction intersecting the first direction;
    a plurality of common electrodes formed in the display area so as to extend in the first direction, for being used for video display and touch detection;
    a plurality of video signal transmission lines arranged along a first edge among edges of a signal line laying area where the video lines and the scan lines are arranged on the substrate;
    a plurality of scan circuits arranged on the substrate along a second edge among the edges of the signal line laying area, the second edge being an edge with which ends of the scan lines are aligned; and
    a common electrode signal transmission line arranged on the substrate along a third edge among the edges of the signal line laying area, the third edge being an edge opposed to the first edge among edge of the signal line laying area, for applying a reference potential signal or a touch detection signal to the common electrode, wherein the signal line laying area has a shape including a first overlapping edge where the first edge overlaps the second edge and a second overlapping edge where the first edge overlaps the third edge, in a part of a frame area positioned outside the signal line laying area on the substrate, the scan circuit is arranged more outward than the video signal transmission line, and in a part of the frame area adjacent to the second overlapping edge, the scan circuit is arranged more outward than the common electrode signal transmission line.

7. The display device according to claim 6, wherein the common electrode signal transmission line includes a first drive signal transmission line to which the touch detection signal is supplied, and a second drive signal transmission line to which the reference potential signal is supplied, the first edge has a common drive circuit, the common drive circuit includes a plurality of switch circuits provided each corresponding to each of the plurality of common electrodes and arranged along the third edge so as to correspond to arrangement of the plurality of common electrodes in the second direction, for switching connection between the each common electrode and the first or second drive signal transmission line, a switch control circuit arranged in the frame area in a non-overlapping part of the third edge excluding the second overlapping edge, for controlling switching by the switch circuit, and a switch control line extending from the switch control circuit to the each switch circuit along the third edge.

8. The display device according to claim 6, wherein the common electrode signal transmission line includes a first drive signal transmission line to which the touch detection signal is supplied, and a second drive signal transmission line to which the reference potential signal is supplied, the first edge has a common drive circuit, the common drive circuit includes a plurality of switch circuits provided each corresponding to each of the plurality of common electrodes and arranged in the frame area in a non-overlapping part of the third edge, among the edges of the signal line laying area, excluding the second overlapping edge, for switching connection between the each common electrode and the first drive signal transmission line or the second drive signal transmission line, a switch control circuit arranged in the frame area in the non-overlapping part, for controlling switching by the switch circuit, and a drive signal distribution line extending from the switch circuit to the each common electrode along the third edge.

9. The display device according to claim 6, wherein the video signal transmission line is provided for every group obtained by dividing the plurality of video lines into groups each including a plurality of adjacent video lines, and the display device further comprises a selector that is a circuit arranged between the video signal transmission line and the first edge, and connected, for every group, via an input thereof to the video signal transmission line, and via an output thereof to the video lines of the group.

10. The display device according to claim 6, wherein the signal line laying area has a shape that is arcuate at least at a part of the second edge, and the substrate has an end shape along the second edge of the signal line laying area at a portion adjacent to the second edge.

* * * * *